US010862340B2

(12) United States Patent
Jung et al.

(10) Patent No.: US 10,862,340 B2
(45) Date of Patent: Dec. 8, 2020

(54) WIRELESS POWER TRANSMISSION APPARATUS AND WIRELESS POWER TRANSMISSION METHOD THEREOF (71) Applicant: Samsung Electronics Co., Ltd., Suwon-si (KR)

(72) Inventors: Jihoon Jung, Suwon-si (KR); Kangho Byun, Suwon-si (KR); Paul Jang, Seongnam-si (KR); Kiyoung Kim, Suwon-si (KR); Jaehyun Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 16/266,619

(22) Filed: Feb. 4, 2019

(65) Prior Publication Data
US 2019/0245386 A1 Aug. 8, 2019

(30) Foreign Application Priority Data
Feb. 6, 2018 (KR) .................. 10-2018-0014636

(51) Int. Cl.
*H02J 50/12* (2016.01)
*G01R 19/00* (2006.01)
*H02J 50/90* (2016.01)
*H02M 7/5387* (2007.01)

(52) U.S. Cl.
CPC .......... *H02J 50/12* (2016.02); *G01R 19/0092* (2013.01); *H02J 50/90* (2016.02); *H02M 7/53871* (2013.01)

(58) Field of Classification Search
CPC ...... H02J 50/12; H02J 50/90; G01R 19/0092; G01R 19/2513; G01R 21/133; H02M 7/53871; H04N 5/63; H04B 5/0037
See application file for complete search history.

(56) References Cited

U.S. PATENT DOCUMENTS 9,490,651 B2    11/2016 Telefus
2012/0326660 A1* 12/2012 Lu .................... H02J 50/005
                                                320/108

FOREIGN PATENT DOCUMENTS

| JP | 5224295 B2 | 7/2013 |
| JP | 2014-176189 A | 9/2014 |
| JP | 5800981 B2 | 10/2015 |
| KR | 10-2015-0032529 A | 3/2015 |
| KR | 10-2015-0045602 A | 4/2015 |
| WO | 2014/007415 A1 | 1/2014 |

* cited by examiner

Primary Examiner — Daniel J Cavallari
(74) Attorney, Agent, or Firm — Jefferson IP Law, LLP (57) ABSTRACT A wireless power transmission apparatus for wirelessly transmitting power to a wireless power reception apparatus is provided. The wireless power transmission apparatus includes a power transmitting circuit including a coil and at least one processor to control to transmit, via the power transmitting circuit, a pilot power with changing a frequency of the pilot power within a predetermined frequency range, obtain a magnitude of power wirelessly transmitted to a wireless power reception apparatus based on the transmitted pilot power, determine an operating frequency based on the obtained magnitude, and control to transmit, via the power transmitting circuit, a driving power having the operating frequency to drive the wireless power reception apparatus.

12 Claims, 6 Drawing Sheets

WIRELESS POWER TRANSMISSION APPARATUS AND WIRELESS POWER TRANSMISSION METHOD THEREOF

CROSS-REFERENCE TO RELATED APPLICATION(S)

This application is based on and claims priority under 35 U.S.C. § 119(a) of a Korean patent application number 10-2018-0014636, filed on Feb. 6, 2018, in the Korean Intellectual Property Office, the disclosure of which is incorporated by reference herein in its entirety.

BACKGROUND

1. Field

The disclosure relates to a wireless power transmission apparatus and a transmission method. More particularly, the disclosure relates to a wireless power transmission apparatus for wirelessly transmitting power to a wireless power reception apparatus and a wireless power transmission method thereof.

2. Description of Related Art

An electronic apparatus according to the related art is connected to a power supplier in a wired manner or is supplied with power through a battery. However, recently, a wireless power transmission apparatus for wirelessly supplying power to an electronic apparatus, a wireless power reception apparatus, and a wireless power transmission/reception system have appeared with the development of electrical and electronic technology.

Wireless power transmission means a power transmission method in which power energy is converted into an electromagnetic wave which may be wirelessly transmitted, and transferred to an electronic apparatus. Here, an apparatus for wirelessly transmitting power is referred to as the wireless power transmission apparatus, and an apparatus for wirelessly receiving power is referred to as the wireless power reception apparatus.

In the case of wireless power transmission, wireless power transmission efficiency may vary depending on a position of the wireless power reception apparatus.

Therefore, in a wireless power transmission technology according to the related art, there has been an inconvenience in that the wireless power reception apparatus needs to be disposed at a predetermined position, or a position of the wireless power reception apparatus needs to be identified through bidirectional communication between the wireless power transmission apparatus and the wireless power reception apparatus.

The above information is presented as background information only, to assist with an understanding of the disclosure. No determination has been made, and no assertion is made, as to whether any of the above might be applicable as prior art with regard to the disclosure.

SUMMARY

Aspects of the disclosure are provided to address at least the above-mentioned problems and/or disadvantages, and to provide at least the advantages described below. Additional aspects will be set forth in part in the description which follows and, in part, will be apparent from the description, or may be learned by practice of the presented embodiments.

Accordingly, an aspect of the disclosure is to provide a wireless power transmission apparatus which sets an operating frequency for wireless power transmission and is capable of wirelessly supplying power to a wireless power reception apparatus through the set operating frequency without a process of fixing a position of the wireless power reception apparatus or communicating with the wireless power reception apparatus, and a wireless power transmission method thereof.

In accordance with an aspect of the disclosure, a wireless power transmission apparatus for wirelessly transmitting power to a wireless power reception apparatus is provided. The apparatus includes a power transmitting circuit including a coil, and at least one processor configured to control to transmit, via the power transmitting circuit, a pilot power with changing a frequency of the pilot power within a predetermined frequency range, obtain a magnitude of power wireless transmitted to a wirelessly power reception apparatus based on the transmitted pilot power, determine an operating frequency based on the obtained magnitude, and control to transmit, via the power transmitting circuit, a driving power having the operating frequency to drive the wireless power reception apparatus.

In accordance with another aspect of the disclosure, a magnitude of the pilot power may be smaller than a magnitude of the driving power.

In accordance with another aspect of the disclosure, the processor may detect a magnitude of a current input to the coil while the pilot power is applied to the coil and identify the magnitude of the power wirelessly transmitted to the wireless power reception apparatus based on the detected magnitude of the current.

In accordance with another aspect of the disclosure, the processor may set a certain frequency within the predetermined frequency range as the operating frequency based on the magnitude of the power wirelessly transmitted to the wireless power reception apparatus by using the pilot power.

In accordance with another aspect of the disclosure, the wireless power transmission apparatus may further include a switch, wherein the processor converts a direct current voltage into an alternating current voltage through a switching operation of the switch and applies the alternating current to the coil.

In accordance with another aspect of the disclosure, the processor may identify a frequency range in which the switching operation of the switch is performed so that a voltage across the switch is 0V within the predetermined frequency range based on the magnitude of the power wirelessly transmitted to the wireless power reception apparatus, and set the certain frequency within the determined frequency range as the operating frequency.

In accordance with another aspect of the disclosure, a wireless power transmission method in which power is wirelessly transmitted to a wireless power reception apparatus is provided. The method includes transmitting a pilot power with changing a frequency of the pilot power within a predetermined frequency range, obtaining a magnitude of power wireless transmitted to a wirelessly power reception apparatus based on the transmitted pilot power, determining an operating frequency based on the obtained magnitude, and transmitting a driving power having the operating frequency to drive the wireless power reception apparatus.

In accordance with another aspect of the disclosure, a magnitude of the pilot power may be smaller than a magnitude of the driving power.

In accordance with another aspect of the disclosure, the wireless power transmission method may further include detecting a magnitude of a current input to the coil while the pilot power is applied to the coil, and identifying the magnitude of the power wirelessly transmitted to the wireless power reception apparatus based on the detected magnitude of the current.

In accordance with another aspect of the disclosure, the wireless power transmission method may further include setting a certain frequency within the predetermined frequency range as the operating frequency based on the magnitude of the power wirelessly transmitted by the wireless power transmission apparatus by using the pilot power.

In accordance with another aspect of the disclosure, the wireless power transmission method may further include converting a direct current voltage into an alternating current voltage through a switching operation of a switch and applying the alternating current voltage to the coil.

In accordance with another aspect of the disclosure, the wireless power transmission method may further include identifying a frequency range in which the switching operation of the switch is performed so that a voltage across the switch is 0 V within the predetermined frequency range based on the magnitude of the power wirelessly transmitted to the wireless power reception apparatus, and setting the certain frequency within the determined frequency range as the operating frequency.

According to the aspects of the disclosure, the wireless power transmission apparatus predicts a position of the wireless power reception apparatus without communicating with the wireless power reception apparatus, and wirelessly provides power to the wireless power reception apparatus by setting the operating frequency depending on the predicted position, thereby making it possible to wirelessly transmit power to the wireless power reception apparatus more conveniently and efficiently.

Other aspects, advantages and salient features of the disclosure will become apparent to those skilled in the art from the following detailed description, which taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purposes only, and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Terms used in the disclosure are used to describe specific embodiments, rather than to limit the scope of the disclosure. Singular forms are intended to include plural forms unless the context clearly indicates otherwise. Throughout the specification, unless described to the contrary, "including" or "comprising" any component will be understood to imply the inclusion of other elements rather than the exclusion of other elements.

A term "-er/or", "module", or the like, described in the specification means a processing unit of at least one function or operation, and may be implemented as hardware or software or a combination of hardware and software. In addition, a plurality of "-ers/ors'" or a plurality of "modules'" may be integrated in at least one module, and may be implemented as at least one processor (not illustrated) except for a 'module' or a '-er/or' that needs to be implemented as specific hardware.

Hereinafter, embodiments of the disclosure will be described in detail with reference to the accompanying drawings so that those skilled in the art to which the disclosure pertains may easily practice the disclosure. However, the disclosure may be modified in various different forms, and is not limited to embodiments described herein. In addition, in the drawings, portions unrelated to the description will be omitted, and similar reference numerals will be used to describe similar portions throughout the specification.

Hereinafter, various embodiments of the disclosure will be described in detail with reference to the accompanying drawings.

Figure 1:
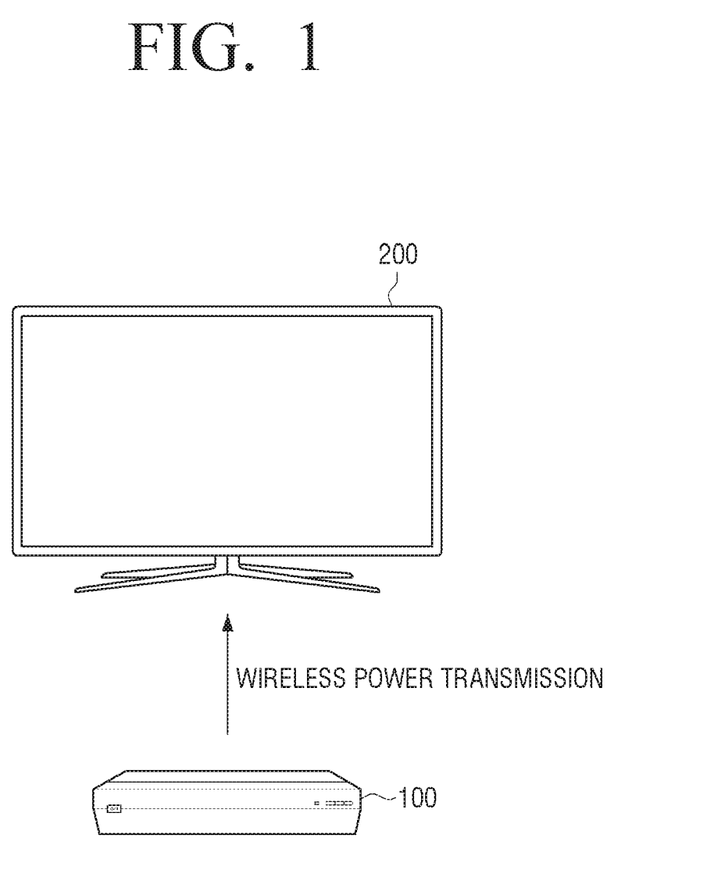
FIG. 1 is a diagram for describing a wireless power transmission apparatus and a wireless power reception apparatus according to an embodiment of the disclosure.

FIG. 1 is a diagram for describing a wireless power system according to an embodiment of the disclosure.

Referring to FIG. 1, a wireless power system includes a wireless power transmission apparatus 100 and a wireless power reception apparatus 200.

The one or more wireless power transmission apparatus 100 may wirelessly transmit, to the one or more wireless power reception apparatus 200, power that is required to drive the one or more wireless power reception apparatus 200.

Here, a wireless power transmission manner includes electromagnetic inductive coupling, resonant magnetic coupling, and the like, but embodiments are not limited thereto.

The electromagnetic inductive coupling is a manner in which power is supplied by using a principle of electromagnetic induction. In detail, in the case of the electromagnetic inductive coupling, when an alternating current flows through a coil of the wireless power transmission apparatus 100, a magnetic field is generated around the coil and a current is induced in a coil of the wireless power reception apparatus 200 under the influence of the magnetic field, such that it is possible to transmit power to the wireless power reception apparatus.

The resonant magnetic coupling is a manner in which power is supplied by using a resonance phenomenon. In detail, in the case of the resonant magnetic coupling, the wireless power transmission apparatus 100 may generate a magnetic field resonating at a resonance frequency and transmit power to the wireless power reception apparatus 200 designed to have the same resonance frequency.

Although a television (TV) is illustrated as the wireless power reception apparatus 200 in FIG. 1, the wireless power reception apparatus 200 is not limited thereto. That is, the wireless power reception apparatus 200 may include various kinds of electronic apparatuses having a configuration in which the electronic apparatus may be wirelessly supplied with power from the wireless power transmission apparatus 100, such as one or more of a mobile phone, a laptop computer, a personal computer, an air-conditioner, a stereo system, and the like. In addition, the wireless power reception apparatus 200 may include one or more of a movable electronic apparatus such as a domestic or industrial robot, a robotic vacuum cleaner, a drone, an electric vehicle, or the like. Further, even in case of an apparatus which newly appears with technology development, the apparatus may be the wireless power reception apparatus 200 of the disclosure as long as the apparatus has a configuration in which the apparatus may be wirelessly supplied with power.

The wireless power transmission apparatus 100 may be implemented as various kinds of electronic apparatuses which may wirelessly transmit power to the wireless power reception apparatus 200.

For example, in a wireless power transmission, the wireless power transmission apparatus 100 and the wireless power reception apparatus 200 may be required to be disposed within a predetermined distance from each other. Therefore, the wireless power transmission apparatus 100 may be implemented as an electronic apparatus which may be disposed within a predetermined distance from the wireless power reception apparatus 200 depending on the kind of wireless power reception apparatus 200.

As a specific example, when the wireless power reception apparatus 200 is implemented as a TV, the wireless power transmission apparatus 100 may be implemented as an electronic apparatus generally disposed around the TV, such as a speaker, a set-top box, a sound bar, or the like.

According to an embodiment of the disclosure, the wireless power transmission apparatus 100 may set an operating frequency for wirelessly transmitting power to the wireless power reception apparatus 200 even without communicating with the wireless power reception apparatus 200. The wireless power transmission apparatus 100 may wirelessly transmit, to the wireless power reception apparatus 200, power through the set operating frequency, and this will be described in greater detail below.

Figure 2:
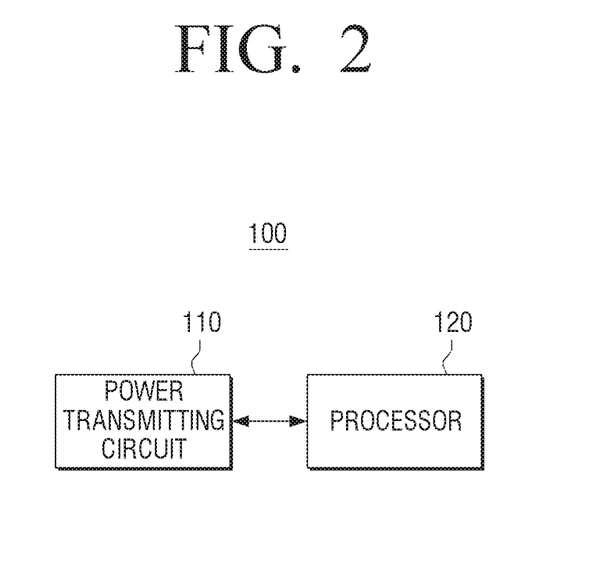
FIG. 2 is a block diagram for describing a configuration of a wireless power transmission apparatus according to an embodiment of the disclosure.

FIG. 2 is a block diagram for describing a configuration of a wireless power transmission apparatus according to an embodiment of the disclosure.

Referring to FIG. 2, the wireless power transmission apparatus 100 includes a power transmitting circuit 110 and at least one processor 120.

The power transmitting circuit 110 wirelessly transmits power to the wireless power reception apparatus 200 as shown in FIG. 1. In an embodiment of the disclosure, wirelessly transmitting power describes a magnetic induction field that is formed by applying a current to a coil in the power transmitting circuit 110. Similarly, in an embodiment of the disclosure, wirelessly receiving power describes a coil that generates an induced electromotive force from a magnetic field formed around the wireless power reception apparatus 200.

The power transmitting circuit 110 may provide power that the wireless power transmission apparatus 100 requires, and wirelessly provide the power to the wireless power reception apparatus 200. The power transmitting circuit 110 may supply power with an alternating current (AC) waveform, and may also supply power with the AC waveform by converting power with a direct current (DC) waveform into the power with the AC waveform by using an inverter. The power transmitting circuit 110 may be implemented in a form which includes a battery, or may be implemented in a form which includes a power reception interface to receive power from an outside source.

In FIG. 1, the electromagnetic inductive coupling and the resonant magnetic coupling are described as representative examples of the wireless power transmission manner. However, the use of the electromagnetic inductive coupling and the resonant magnetic coupling as the wireless power transmission manner is merely one embodiment, and the wireless power transmitter 110 is not limited to wirelessly transmit power by using the electromagnetic inductive coupling or the resonant magnetic coupling. That is, a wireless power transmission manner commercialized in future with technology development may also be used by the power transmitting circuit 110 to wirelessly transmit power.

The processor 120 is a component for controlling a general operation of the wireless power transmission apparatus 100.

In detail, the processor 120 may control various hardware and/or software components included in the wireless power transmission apparatus 100, and perform various data processing and operations. To this end, the processor 120 may be implemented as a dedicated processor (for example, an embedded processor) for performing a corresponding operation or as a generic-purpose processor (for example, a central processing unit (CPU)) capable of performing corresponding operations by executing one or more software programs stored in a memory device (not shown).

The processor 120 may control a magnitude of power transmitted by the power transmitting circuit 110. The processor 120 may control the magnitude of the power wirelessly transmitted by the power transmitting circuit 110 by, for example, changing a frequency of a voltage applied to the power transmitting circuit 110, but embodiments are not limited thereto.

In addition, the processor 120 may control the magnitude of the power transmitted by the power transmitting circuit 110 by changing a magnitude of the voltage applied to the power transmitting circuit 110. For example, the processor 120 may transmit low power to the wireless power reception apparatus 200 by applying a voltage low enough not to drive a load of the wireless power reception apparatus 200. Further, the processor 120 may allow the power transmitting circuit 110 to transmit adequate power to drive the wireless power reception apparatus 200 by applying a voltage of which a magnitude is enough to drive the wireless power reception apparatus 200. Here, the driving of the wireless power reception apparatus 200 means that the wireless power reception apparatus 200 performs a function thereof. For example, in the case where the wireless power reception apparatus 200 is a TV, the TV in an ON state may display a screen to a user. In this connection, in an embodiment of the disclosure, a voltage high enough to drive the wireless power reception apparatus 200 is referred to as a driving voltage.

The processor 120 may use a pilot voltage to identify the driving voltage. In an embodiment of the disclosure, the pilot voltage means a voltage that is applied to the power transmitting circuit 110 before the wireless power transmission apparatus 100 wirelessly transmits power to the wireless power reception apparatus 200 to set an operating frequency and the driving voltage for driving the wireless power reception apparatus 200.

A magnitude of the pilot voltage may be small enough so as not to strain the wireless power reception apparatus 200 even when the wireless power transmission apparatus 100 wirelessly transmits power while scanning a frequency in a predetermined range. For example, when a magnitude of an alternating current (AC) voltage input to the wireless power transmission apparatus 100 is 311 V, the pilot voltage may be set to 25 V. However, the magnitude of the pilot voltage is not necessarily limited thereto, and may vary depending on characteristics of the wireless power transmission apparatus 100.

The processor 120 may transmit, via the power transmitting circuit, a pilot power with changing a frequency of the pilot power within the predetermined frequency range. Here, the pilot power may having the pilot voltage.

The processor 120 may obtain a magnitude of power wirelessly transmitted to the wireless power reception apparatus 200 based on the transmitted pilot power. The processor 120 may identify a magnitude of power wirelessly transmitted to the wireless power reception apparatus 200 by the pilot voltage by changing a frequency of the pilot voltage within a predetermined frequency range.

The processor 120 may determine the operating frequency based on the obtained magnitude. The processor 120 may set a certain frequency within the predetermined frequency range as the operating frequency based on a magnitude of the wirelessly transmitted power identified by using the pilot voltage.

Here, the operating frequency is a frequency of a voltage applied to the power transmitting circuit 110 to wirelessly transmit power to the wireless power reception apparatus 200, and may be a frequency with the highest wireless power transmission efficiency in the predetermined frequency range. The wireless power transmission efficiency being high means that a ratio of a magnitude of power wirelessly received by the wireless power reception apparatus 200 to a magnitude of power wirelessly transmitted by the wireless power transmission apparatus 100 is high.

After identifying the operating frequency by using the pilot power, the processor 120 may identify the driving voltage or driving power at which the wireless power reception apparatus 200 may be driven by increasing a magnitude of the voltage at the identified operating frequency.

In detail, when the wireless power transmission apparatus 100 wirelessly transmits the power to the wireless power reception apparatus 200 by using the pilot voltage, the wireless power reception apparatus 200 wirelessly receiving the power may not perform its original function because the magnitude of the pilot voltage is small.

However, some components of the wireless power reception apparatus 200 wirelessly receiving the power by using the pilot voltage may be operated. For example, when wirelessly receiving the power by using the pilot voltage, a communicator of the wireless power reception apparatus 200 is switched into an ON state, such that the wireless power reception apparatus 200 may communicate with the wireless power transmission apparatus 100.

The wireless power reception apparatus 200 in a state where it may perform communication may transmit, to the wireless power transmission apparatus 100, information such as a voltage of a wireless power receiver (not illustrated), a power consumption, or the like.

The wireless power transmission apparatus 100 may obtain (or predict) a magnitude of power required to drive the wireless power reception apparatus 200 by using the information received from the wireless power reception apparatus 200, such as the voltage of the wireless power receiver (not illustrated), the power consumption, or the like. The wireless power transmission apparatus 100 may increase the magnitude of the voltage applied to the power transmitting circuit 110 to wirelessly transmit power at the magnitude required to drive the wireless power reception apparatus 200.

In detail, the processor 120 may identify whether the magnitude of the power transmitted by the power transmitting circuit 110 is equal to the magnitude of the power required to drive the wireless power reception apparatus 200 while increasing the magnitude of the voltage applied at the operating frequency identified by using the pilot voltage.

The processor 120 may increase the magnitude of the voltage applied to the power transmitting circuit 110 until the magnitude of the power transmitted by the power transmitting circuit 110 is equal to the magnitude of the power required to drive the wireless power reception apparatus 200.

Then, the processor 120 may identify the magnitude of the voltage applied to the power transmitting circuit 110 as the driving voltage when the magnitude of the power transmitted by the power transmitting circuit 110 is equal to the magnitude of the power required to drive the wireless power reception apparatus 200.

As such, the processor 120 may identify the operating frequency at which the power is wirelessly transmitted to the wireless power reception apparatus 200 by using the pilot voltage and identify the driving voltage applied to the power transmitting circuit 110 when transmitting the power required to drive the wireless power reception apparatus 200 by increasing the magnitude of the voltage at the operating frequency.

Figure 3:
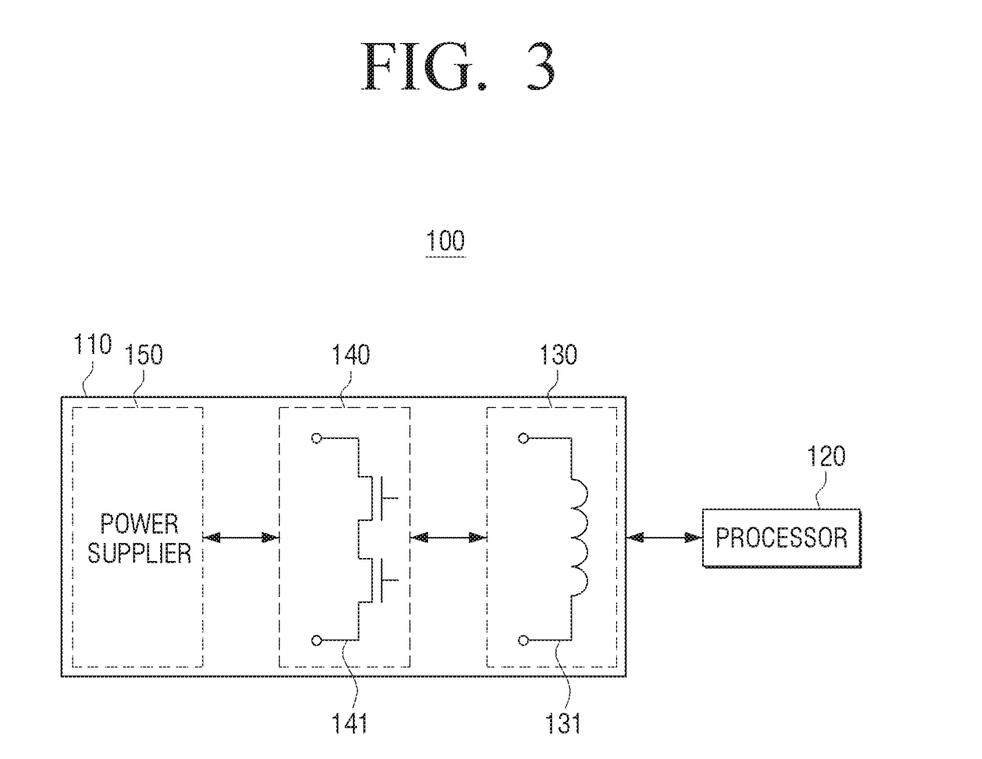
FIG. 3 is a diagram for describing a wireless power transmission apparatus according to an embodiment of the disclosure.

FIG. 3 is a diagram for describing a wireless power transmission apparatus according to an embodiment of the disclosure in detail.

Referring to FIG. 3, the power transmitting circuit 110 of the wireless power transmission apparatus 100 may include a power supplier 150, an inverter 140, and a resonator 130.

The power supplier 150 may generate a certain level of DC voltage by using power input from an outside source or from an internal battery. For example, the power supplier 150 may receive a commercial AC voltage from the outside, convert the commercial AC voltage into a DC voltage, and convert the DC voltage into a certain level of DC voltage.

The inverter 140 may receive the DC voltage and output an AC voltage through a switching operation of a switch 141.

The resonator 130 may receive the AC voltage and be magnetically coupled to a resonator (not shown) of the wireless power reception apparatus 200, thereby wirelessly providing power. To this end, the resonator 130 may include a coil 131.

The processor 120 may control the power transmitting circuit 110 to apply a voltage to the coil 131 of the power transmitting circuit 110.

In detail, the processor 120 may control the power supplier 150 to generate a certain level of DC voltage, such that the certain level of DC voltage is supplied to the inverter 140. Further, the processor 120 may control the switching operation of the switch 141 to adjust a magnitude or frequency of an AC voltage output from the inverter 140, thereby adjusting a magnitude or frequency of the AC voltage applied to the coil 131.

The processor 120 may set the operating frequency of the voltage applied to the coil 131 to wirelessly transmit power to the wireless power reception apparatus 200.

In detail, when the wireless power transmission apparatus 100 or the wireless power reception apparatus 200 is disposed at a position other than a predetermined position for a resonance characteristic, the resonance characteristic may be changed. In this case, the wireless power transmission apparatus 100 needs to set the driving voltage and the operating frequency depending on the changed resonance characteristic.

The switch 141 of the inverter 140 may be implemented as a transistor. Although two transistors are illustrated in FIG. 3, this is only an example, and the number and/or arrangement of transistors is not limited thereto.

When a positive voltage ((+) voltage) is applied to one of the two transistors, the transistor to which the positive voltage is applied is switched ON, and a negative voltage ((−) voltage) is applied to the other transistor, such that the transistor to which the negative voltage is applied is switched OFF. In contrast, when the negative voltage is applied to one of the two transistors, the transistor to which the negative voltage is applied is switched OFF, and the positive voltage is applied to the other transistor, such that the transistor to which the positive voltage is applied is switched ON.

The processor 120 may perform the switching operation by changing a direction and a cycle of an input voltage Vin applied to each transistor of the power transmitting circuit 110. Further, the processor 120 may convert the DC voltage applied to the power transmitting circuit 110 into an AC voltage through the switching operation as described above, thereby applying the AC voltage to the coil 131 of the power transmitting circuit 110.

At a point in time when the voltage applied to the transistor is changed from positive (+) to negative (−), or from negative (−) to positive (+), a voltage across the transistor may be 0 V. That is, the voltage across the switch may be substantially 0 V at a point in time when the switch is turned ON or turned OFF, and such a state is referred to as zero voltage switching (ZVS).

The processor 120 may identify a ZVS region through the switching operation in the power transmitting circuit 110. That is, when the pilot voltage is applied to the wireless power transmission apparatus 100, the processor 120 may identify the ZVS region of the wireless power transmission apparatus 100 through the switching operation in the power transmitting circuit 110.

The processor 120 may identify the ZVS region through the switching operation after applying the pilot voltage to the wireless power transmission apparatus 100, and identify that the wireless power reception apparatus may be driven at a certain frequency in the ZVS region of the wireless power transmission apparatus 100.

The resonator 130 may include the at least one coil 131, which is a component for generating a magnetic field required to transmit power from the wireless power transmission apparatus 100 to the wireless power reception apparatus 200.

When the wireless power transmission apparatus 100 transmits power only by the electromagnetic inductive coupling, the resonator 130 may include only an induction coil, and when the wireless power transmission apparatus 100 transmits power only by the resonant magnetic coupling, the resonator 130 may include only a resonant coil. When the wireless power transmission apparatus 100 transmits power by a combination of the electromagnetic inductive coupling and the resonant magnetic coupling, the resonator 130 may include both of the induction coil and the resonant coil. In addition, one induction coil or resonant coil may be provided, or a plurality of induction coils or resonant coils may be provided.

An AC voltage generated through the switching operation of the transistors is applied to the coil 131. A magnetic field is generated as an AC current of which a magnitude varies depending on a frequency of the AC voltage flows, and the wireless power transmission apparatus 100 may transmit power to the wireless power reception apparatus 200 by using the generated magnetic field. In detail, as a current is induced in a coil (not shown) of the wireless power reception apparatus 200 under the influence of the magnetic field generated in the wireless power transmission apparatus 100, the power may be transmitted to elements within the wireless power reception apparatus 200.

The wireless power reception apparatus 200 may include the resonator (not illustrated) and a device load (not illustrated).

The device load comprises a resistance applied to the wireless power reception apparatus 200. The value of the device load may vary depending on the kind or state of the wireless power reception apparatus 200. For example, in a state where the TV is turned off, a value of the device load from the point of view of the TV may be 3000Ω. In addition, a capacitance of the device load may be increased or decreased by connecting or removing a resistor with or from the device load.

The resonator (not illustrated) of the wireless power reception apparatus 200 may include at least one of the induction coil or the resonant coil, similar to the resonator 130 of the wireless power transmission apparatus 100. The coil of the wireless power reception apparatus 200 may receive power wirelessly transmitted from the wireless power transmission apparatus 100 by using the magnetic field generated in the wireless power transmission apparatus 100. In this case, a magnitude of the power received by the wireless power reception apparatus 200 may vary depending on the wireless power transmission efficiency.

Figure 4A:
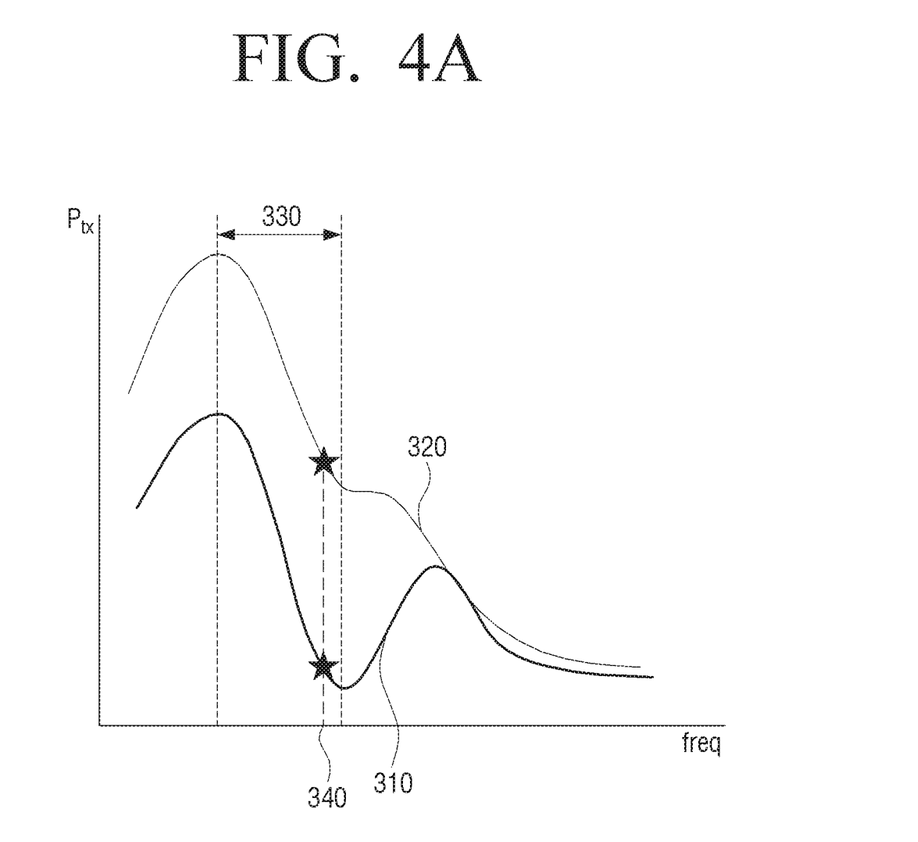
FIGS. 4A and 4B are diagrams for describing a wireless power transmission method according to various embodiments of the disclosure.

A graph of FIG. 4A shows a magnitude of wirelessly transmitted power with respect to a frequency according to an embodiment of the disclosure.

Figure 4B:
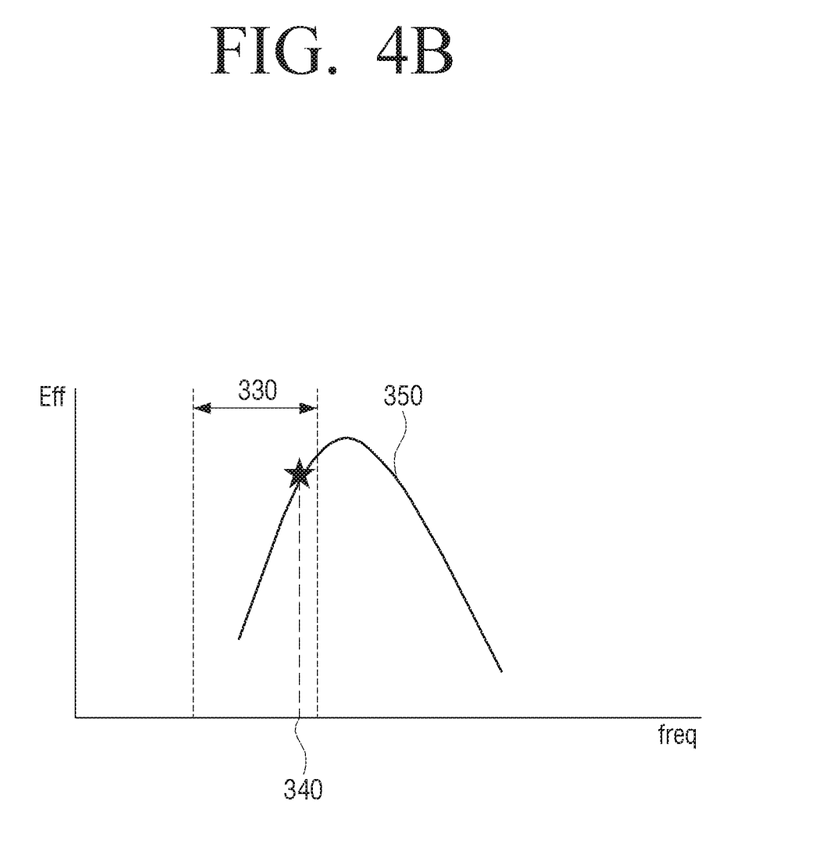

A graph of FIG. 4B shows wireless power transmission efficiency with respect to a frequency according to an embodiment of the disclosure.

Referring to FIG. 4A, graphs 310 and 320 show a magnitude of wirelessly transmitted power with respect to a frequency of the pilot voltage when applying the pilot voltage to the wireless power reception apparatus 200, and a magnitude of wirelessly transmitted power with respect to a frequency of the driving voltage when applying the driving voltage to the wireless power reception apparatus 200, respectively. A horizontal axis of the graph of FIG. 4A represents a frequency of a voltage applied to the wireless power reception apparatus 200, and a vertical axis represents a magnitude of power wirelessly received by the wireless power reception apparatus 200.

As illustrated in FIG. 4A, the graphs 310 and 320 have forms that are similar to each other in a frequency range 330 in which the wireless power reception apparatus 200 may be driven. Accordingly, a magnitude of the wirelessly transmitted power at the driving voltage may be obtained by using the pilot voltage.

In detail, the processor 120 may obtain the magnitude of the power wirelessly transmitted to the wireless power reception apparatus 200 by using the pilot voltage by changing a frequency of the pilot voltage within a predetermined frequency range, the pilot voltage having a predetermined magnitude and being applied to the coil 131.

The processor 120 may set a certain frequency within the predetermined frequency range as the operating frequency based on the magnitude of the wirelessly transmitted pilot power identified by using the pilot power, and wirelessly transmit the driving power having the operating frequency to drive the wireless power reception apparatus 200 by applying the driving voltage having the operating frequency to the coil 131.

Here, the predetermined frequency range may be a frequency range in which the wireless power reception apparatus 200 may be driven.

In detail, the processor 120 may identify the magnitude of the power wirelessly transmitted to the wireless power reception apparatus 200 by the pilot voltage by changing the frequency of the pilot voltage.

That is, as the frequency of the pilot voltage applied to the coil 131 is changed, a magnitude of a current flowing through the coil 131 is changed and thus, the magnitude of the power transmitted to the wireless power reception apparatus 200 is also changed. Here, the magnitude of the power transmitted to the wireless power reception apparatus 200 is in proportion to the magnitude of the current input to the coil 131. Therefore, the processor 120 may detect the magnitude of the current input to the coil 131 while the pilot voltage is applied to the coil 131 and obtain the power wirelessly transmitted to the wireless power reception apparatus based on the detected magnitude.

Further, the processor 120 may set a certain frequency within the predetermined frequency range as the operating frequency based on the magnitude of the power wirelessly transmitted by the wireless power transmission apparatus 100 by the pilot voltage.

To this end, the processor 120 may identify a frequency range in which the wireless power reception apparatus 200 may be driven based on the magnitude of the power wirelessly transmitted by the wireless power transmission apparatus 100 by the pilot voltage.

For example, a case where the magnitude of the power transmitted to the wireless power reception apparatus 200 is as shown by the graph 310 of FIG. 4A is assumed, the magnitude is obtained by using the pilot voltage.

Referring to FIG. 4A, the magnitude of the power transmitted to the wireless power reception apparatus 100 may be plotted as a graph having three inflection points.

Here, among the three inflection points of the graph 310 of FIG. 4A, an inflection point where a value of the frequency is smallest is referred to as a first inflection point, an inflection point where the value of the frequency is next smallest is referred to as a second inflection point, and an inflection point where the value of the frequency is largest is referred to as a third inflection point. In this case, the magnitude of the wirelessly transmitted power is largest at the first inflection point. In addition, it may be appreciated that a change amount of the power depending on the frequency of the pilot voltage from the first inflection point to the second inflection point is similar to that of the power depending on the frequency of the driving voltage from the first inflection point to the second inflection point.

Here, the processor 120 may identify the frequency range 330 between the first inflection point and the second inflection point as the frequency range in which the wireless power reception apparatus 200 may be driven.

A form of the graph may be changed depending on a resonant topology. For example, the form of the graph may also be plotted as a graph having two inflection points in some cases. Even in this case, the magnitude of the wirelessly transmitted power is largest at a first inflection point, and a frequency range 330 between the first inflection point and a second inflection point may be identified as the frequency range in which the wireless power reception apparatus 200 may be driven.

Here, a region in which the magnitude of the wirelessly transmitted power is decreased with the increase of the frequency corresponds to the ZVS region as described above. Therefore, the frequency range 330 between the first inflection point and the second inflection point may correspond to the ZVS region of the wireless power transmission apparatus 100.

The processor 120 may set a certain frequency within a predetermined frequency range as the operating frequency. Here, the predetermined frequency range may be the frequency range 330 between the first inflection point and the second inflection point described above, that is, the ZVS region of the wireless power transmission apparatus 100. In detail, the processor 120 may identify the operating frequency in consideration of transmission efficiency of the power wirelessly transmitted from the wireless power transmission apparatus 100 to the wireless power reception apparatus 200.

In detail, the transmission efficiency of the power wirelessly transmitted from the wireless power transmission apparatus 100 to the wireless power reception apparatus 200 may vary depending on the frequency. For example, the transmission efficiency may be plotted as the graph 350 of FIG. 4B.

Referring to FIG. 4B, the wireless power transmission efficiency may be plotted as a two-directional curve in a form in which the wireless power transmission efficiency is increased with the increase of the frequency, and is decreased again.

Therefore, it may be appreciated that the wireless power transmission efficiency is increased with the increase of the frequency in the frequency range 330 in which the wireless power reception apparatus 200 may be driven, that is, the ZVS region. That is, the wireless power transmission efficiency is highest in a region in which the frequency is highest in the ZVS region, that is, at the second inflection point.

However, in case that the second inflection point at which the wireless power transmission efficiency is highest is set as the operating frequency, when power is wirelessly transmitted at a frequency any larger than the operating frequency, an excessive amount of power, that is out of the frequency range in which the wireless power reception apparatus 200 may be driven, is transmitted to the wireless power reception apparatus 200, such that the wireless power reception apparatus 200 may be overloaded.

In order to prevent the problem as described above from occurring, according to the embodiment of the disclosure, a frequency smaller than the frequency at the second inflection point by a predetermined frequency may be set as the operating frequency 340.

The processor 120 may identify the magnitude of the driving voltage by increasing the magnitude of the pilot voltage after setting the operating frequency. In detail, the processor 120 identifies the magnitude of the generated power by increasing the magnitude of the voltage at the operating frequency. In this case, when the magnitude of the generated power is equal to a magnitude of adequate power for wireless power transmission, a voltage of the generated power may be identified as the driving voltage.

Here, adequate power means a value of power predetermined in consideration of characteristics of the wireless power reception apparatus 200, and may have a different value depending on the kind of wireless power reception apparatus 200, or the like. The wireless power transmission apparatus 100 may store information on the value of the adequate power in a storage (not illustrated).

As such, the processor 120 may identify the driving voltage by using the operating frequency and the adequate power, and wirelessly transmit, to the wireless power reception apparatus 200, the power required to drive the wireless power reception apparatus 200.

When wirelessly receiving the power of which the magnitude is equivalent to the adequate power, the wireless power reception apparatus 200 may turn on the wireless power reception apparatus 200. Further, when the wireless power reception apparatus 200, which is turned on, includes the communicator (not illustrated), the wireless power reception apparatus 200 may communicate with other electronic apparatuses including the wireless power transmission apparatus 100.

Figure 5:
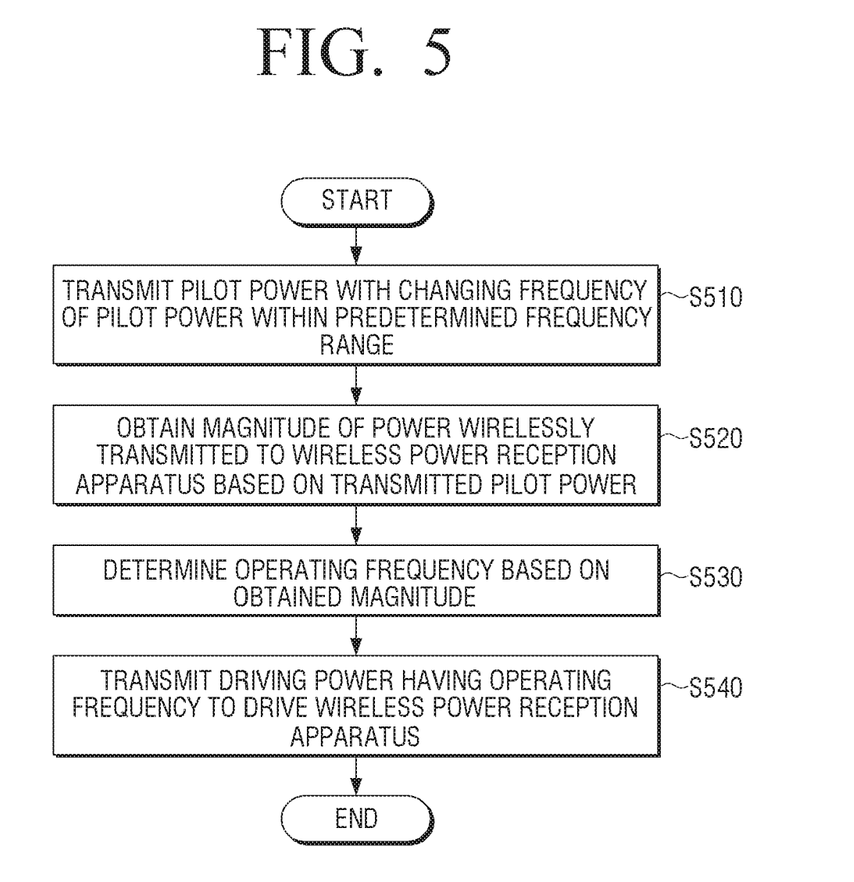
FIG. 5 is a flowchart for describing a wireless power transmission method according to an embodiment of the disclosure.

FIG. 5 is a flowchart for describing a wireless power transmission method according to an embodiment of the disclosure.

Referring to FIG. 5, a pilot power is transmitted with changing a frequency of the pilot power within a predetermined frequency range at 5510.

Then, a magnitude of power wireless transmitted to a wirelessly power reception apparatus is obtained based on the transmitted pilot power at 5520.

Here, the magnitude of the pilot power may be smaller than that of the driving power.

Further, a magnitude of a current input to the coil while the pilot voltage is applied to the coil may be detected, and the magnitude of the power wirelessly transmitted to the wireless power reception apparatus 200 may be obtained based on the detected magnitude of the current.

Then, the operating frequency is determined based on the obtained magnitude at 5530. In detail, when the wireless power transmission apparatus 100 wirelessly transmits the power to the wireless power reception apparatus 200 by using the pilot power, the magnitude of the wirelessly transmitted power may vary depending on the frequency. The wireless power transmission apparatus 100 may identify the operating frequency in a region in which the magnitude of the power wirelessly transmitted to the wireless power reception apparatus 200 is decreased. That is, a certain frequency within the predetermined frequency range may be set as the operating frequency based on the magnitude of the power wirelessly transmitted by the wireless power transmission apparatus 100 by using the pilot voltage.

Then, a driving power having the operating frequency to drive the wireless power reception apparatus 200 is transmitted at 5540.

Then, a DC voltage may be converted into an AC voltage through the switching operation of the switch and the AC voltage may be applied to the coil.

Further, a frequency range in which the switching operation of the switch is performed so that a voltage across the switch is 0 V may be identified within the predetermined frequency range based on the magnitude of the power wirelessly transmitted to the wireless power reception apparatus 200, and a certain frequency within the identified frequency range may be set as the operating frequency. In detail, when the wireless power transmission apparatus 200 wirelessly transmits the power to the wireless power reception apparatus 200 by using the pilot voltage, a region in which the magnitude of the wireless transmitted power is decreased as the frequency is increased appears, and this region corresponds to the ZVS region. Accordingly, it is possible to identify the ZVS region, and a certain frequency within the ZVS region may be set as the operating frequency.

Any of the wireless power transmission methods according to the various embodiments described above may be implemented as a program and be provided to the wireless power transmission apparatus. Particularly, a program including the wireless power transmission method may be stored and provided in a non-transitory computer-readable medium.

The non-transitory computer-readable medium is not a medium that stores data therein for a while, such as a register, a cache, a memory, or the like, but means a medium that semi-permanently stores data therein and is readable by an apparatus. In detail, the programs or applications for the wireless power transmission method may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

As described above, according to various embodiments of the disclosure, the wireless power transmission apparatus 100 may wirelessly transmit power to the wireless power reception apparatus 200. In particular, the power required to drive the wireless power reception apparatus 200 may be transmitted without performing communication between the wireless power transmission apparatus 100 and the wireless power reception apparatus 200. Therefore, a time for which the wireless power reception apparatus 200 is switched from an OFF state to the ON state may be shortened.

Further, various embodiments of the disclosure have been described above, but the content of the disclosure is not limited to the embodiments described above. Accordingly, various modifications may be made by those having ordinary knowledge in the art to which the disclosure pertains without departing from the gist of the disclosure as disclosed in the accompanying claims. These modifications should also be understood to fall within the scope and spirit of the disclosure.

While the disclosure has been shown and described with reference to various embodiments thereof, it will be understood by those skilled in the art that various changes in form and detail may be made therein without departing from the spirit and scope of the disclosure as defined by the appended claims and their equivalents.

What is claimed is:

1. A wireless power transmission apparatus comprising:
  a power transmitting circuit including a coil; and at least one processor configured to:
  control to transmit, via the power transmitting circuit, a pilot power with changing a frequency of the pilot power within a predetermined frequency range,
  obtain a magnitude of power wirelessly transmitted to a wireless power reception apparatus based on the transmitted pilot power,
  determine an operating frequency based on the obtained magnitude, and
  control to transmit, via the power transmitting circuit, a driving power having the operating frequency to drive the wireless power reception apparatus.

2. The wireless power transmission apparatus as claimed in claim 1, wherein a magnitude of the pilot power is smaller than a magnitude of the driving power.

3. The wireless power transmission apparatus as claimed in claim 1, wherein the at least one processor is further configured to:
  detect a magnitude of a current input to the coil while the pilot power is applied to the coil, and
  identify the magnitude of the power wirelessly transmitted to the wireless power reception apparatus based on the detected magnitude of the current.

4. The wireless power transmission apparatus as claimed in claim 1, wherein the at least one processor is further configured to:
  set a certain frequency within the predetermined frequency range as the operating frequency based on the magnitude of the power wirelessly transmitted by the wireless power transmission apparatus by using the pilot power.

5. The wireless power transmission apparatus as claimed in claim 4, further comprising:
  a switch,
  wherein the at least one processor is further configured to:
    convert a direct current voltage into an alternating current voltage through a switching operation of the switch, and
    apply the alternating current voltage to the coil.

6. The wireless power transmission apparatus as claimed in claim 5, wherein the at least one processor is further configured to:
  identify a frequency range in which the switching operation of the switch is performed so that a voltage across the switch is 0 V within the predetermined frequency range based on the magnitude of the power wirelessly transmitted to the wireless power reception apparatus, and
  set the certain frequency within the identified frequency range as the operating frequency.

7. A wireless power transmission method comprising:
  transmitting a pilot power with changing a frequency of the pilot power within a predetermined frequency range;
  obtaining a magnitude of power wirelessly transmitted to a wireless power reception apparatus based on the transmitted pilot power;
  determining an operating frequency based on the obtained magnitude; and
  transmitting a driving power having the operating frequency to drive the wireless power reception apparatus.

8. The wireless power transmission method as claimed in claim 7, wherein a magnitude of the pilot power is smaller than a magnitude of the driving power.

9. The wireless power transmission method as claimed in claim 7, wherein the method further comprises:
  detecting a magnitude of a current input to a coil while the pilot power is applied to the coil; and
  identifying the magnitude of the power wirelessly transmitted to the wireless power reception apparatus based on the detected magnitude of the current.

10. The wireless power transmission method as claimed in claim 7, wherein in the determining of the operating frequency, a certain frequency within the predetermined frequency range is set as the operating frequency based on the magnitude of the power wirelessly transmitted by a wireless power transmission apparatus by using the pilot power.

11. The wireless power transmission method as claimed in claim 10, wherein the method further comprises:
  converting a direct current voltage into an alternating current voltage through a switching operation of a switch; and
  applying the alternating current voltage to a coil.

12. The wireless power transmission method as claimed in claim 11, wherein the determining of the operating frequency comprises:
  identifying a frequency range in which the switching operation of the switch is performed so that a voltage across the switch is 0 V within the predetermined frequency range based on the magnitude of the power wirelessly transmitted to the wireless power reception apparatus; and
  setting the certain frequency within the identified frequency range as the operating frequency.

* * * * *